(12) United States Patent
Stroeks et al.

(10) Patent No.: US 8,778,247 B2
(45) Date of Patent: Jul. 15, 2014

(54) POLYAMIDE FILMS FOR FLEXIBLE PRINTED CIRCUIT BOARDS

(75) Inventors: Alexander Antonius Marie Stroeks, Valkenburg aan de Geul (NL); Guido Richard Struijk, Born (NL)

(73) Assignee: DSM IP Assets B.V., Heerlen (NL)

( * ) Notice: Subject to any disclaimer, the term of this patent is extended or adjusted under 35 U.S.C. 154(b) by 275 days.

(21) Appl. No.: 13/144,759

(22) PCT Filed: Jan. 15, 2010

(86) PCT No.: PCT/EP2010/050451
§ 371 (c)(1),
(2), (4) Date: Oct. 3, 2011

(87) PCT Pub. No.: WO2010/081873
PCT Pub. Date: Jul. 22, 2010

(65) Prior Publication Data
US 2012/0024577 A1 Feb. 2, 2012

(30) Foreign Application Priority Data

Jan. 16, 2009 (EP) .................................... 09150776
Dec. 18, 2009 (EP) .................................... 09179948

(51) Int. Cl.
*B29C 47/88* (2006.01)
*B29C 71/00* (2006.01)
*B29C 55/12* (2006.01)

(52) U.S. Cl.
USPC ............... 264/210.5; 264/178 R; 264/210.1; 264/210.7; 264/211.13; 264/211.2; 264/172.19; 264/235.6; 264/235.8; 264/290.2; 264/331.19; 524/606; 528/308; 528/308.6; 528/336; 525/420; 525/432

(58) Field of Classification Search
None
See application file for complete search history.

(56) References Cited

U.S. PATENT DOCUMENTS

| | | | |
|---|---|---|---|
| 5,053,281 A | 10/1991 | Sakashita et al. | |
| 5,268,219 A * | 12/1993 | Harada et al. ................. | 428/220 |
| 5,324,766 A | 6/1994 | Ikejiri et al. | |
| 5,504,146 A | 4/1996 | Goetz et al. | |
| 5,891,987 A | 4/1999 | Yuo et al. | |
| 6,376,093 B1 | 4/2002 | Fujita et al. | |
| 2004/0214948 A1 | 10/2004 | Hayashi et al. | |
| 2004/0224112 A1* | 11/2004 | Maruyama et al. .......... | 428/35.7 |
| 2011/0015324 A1* | 1/2011 | Hara et al. .................... | 524/381 |

FOREIGN PATENT DOCUMENTS

| | | |
|---|---|---|
| EP | 0 456 912 | 11/1991 |
| JP | WO2009119860 | * 10/2009 |
| WO | WO 2009/012936 | 1/2009 |

OTHER PUBLICATIONS

International Search Report for PCT/EP2010/050451, mailed May 6, 2010.
Database WPI Week 199022, Accession No. 1990-166876 & JP 02-106319, Apr. 18, 1990.

* cited by examiner

*Primary Examiner* — Jeffrey Wollschlager
(74) *Attorney, Agent, or Firm* — Nixon & Vanderhye P.C.

(57) ABSTRACT

The invention relates to a polymer film made of a polyamide composition comprising at least 80 weight percentage (wt. %) of a semi-crystalline semi-aromatic polyamide with a melting temperature (Tm) of at least 270° C., wherein the wt. % is relative to the total weight of the polymer composition, wherein the polymer film has an average coefficient of thermal expansion in plane in the temperature range of 20° C.-Tg, measured in plane with the method according to ASTM D969-08, of at most 40 ppm/K. The said film can be made from a polyamide moulding composition comprising said polyamide by film casting followed by biaxial stretching. The film has properties suitable for carrier films in flexible printed circuit boards.

7 Claims, No Drawings

POLYAMIDE FILMS FOR FLEXIBLE PRINTED CIRCUIT BOARDS

This application is the U.S. national phase of International Application No. PCT/EP2010/050451, filed 15 Jan. 2010, which designated the U.S. and claims priority to EP application Ser. No. 09150776.4, filed 16 Jan. 2009; and EP application Ser. No. 09179948.6, filed 18 Dec. 2009, the entire contents of each of which are hereby incorporated by reference.

The invention relates to polymer films for use in electrical applications and in particular to high heat resistant polymer films that can be used as carrier in flexible printed circuit boards.

A printed circuit board, or PCB, is used to mechanically support and electrically connect electronic components using conductive pathways, tracks, or traces, etched from conductive metal layers laminated onto a non-conductive substrate or carrier. PCBs are also referred to as printed wiring board (PWB) or etched wiring board. A PCB populated with electronic components is indicated as a printed circuit assembly (PCA), also known as a printed circuit board assembly (PCBA).

PCBs are more suited for high-volume production and cheaper than either wire-wrapped or point-to-point constructed circuits. In recent years, the use of PCBs has grown enormously as a result of increasing number of E&E applications in consumer products and the ongoing demand for smaller electronics packaging and greater functionality.

Conductive layers in PCBs are typically made of thin copper foil or copper cladding. For the carrier often insulating layers or dielectrics, such as polytetrafluoroethylene (Teflon), are laminated together with a resin prepreg, such as fiber reinforced epoxy resin prepregs. Thermal expansion is an important consideration, and glass fiber reinforcement offers the best dimensional stability.

Different methods are used to provide the conductive layers. The vast majority of printed circuit boards are made by bonding a layer of copper over the entire substrate, sometimes on both sides, then removing unwanted copper after applying a temporary mask (e.g. by etching), leaving only the desired copper traces. Sometimes PCBs are made by adding traces to the bare substrate (or a substrate with a very thin layer of copper) usually by a complex process of multiple electroplating steps.

After the printed circuit board (PCB) is completed, electronic components must be attached to form a functional "printed circuit board assembly" (PCBA). In through-hole construction, component leads are inserted in holes. In surface-mount construction, the components are placed on pads or lands on the outer surfaces of the PCB. In both kinds of construction, component leads are electrically and mechanically fixed to the board with a molten metal solder. Alternatively flip chip components are applied, which also might need high heat processing. Nowadays with the development of board lamination and etching techniques, the surface mounting concept has evolved into the standard printed circuit board fabrication process.

There is a variety of soldering techniques used to attach components to a PCB. High volume production is usually done with machine placement and bulk wave soldering or reflow ovens. Surface mounting lends itself well to a high degree of automation, reducing labor costs and greatly increasing production and quality rates.

For reasons including further enhancing automation and size reduction of PCB's, flexible films rather than rigid carriers are used. Such polymer films are also called carrier tapes. The corresponding flexible printed circuit boards are also indicated as flexible printed circuit boards, with the denotation FCB rather than PCB.

The soldering processes used tend to be carried out at elevated temperature, for example at 250° C. or even higher, which require materials with high temperature resistance, good dimensional stability, good dielectric properties. Furthermore, such materials must have a good humidity resistance since this could otherwise corroborate the soldering process and/or the longevity of the PCA so produced.

The material most widely used in carrier tapes for FCBs is polyimide (PI), commonly known under the trade name Kapton. Kapton is a polyimide film developed by DuPont which can remain stable in a wide range of temperatures, from −273 to +400° C. (0-673 K). Kapton is used in flexible printed circuits (flexible electronics) among other things, like thermal micrometeoroid garments and outside layers of space suits. A disadvantage of Kapton is that these films are very expensive, as these are produced from expensive monomers and involving solution casting. Other materials considered for carrier tape in FCBs are for example polyetheretherketone (PEEK) and liquid crystal polymers (LCP), which are also rather expensive, and polyethylene terephtahalate (PET), polyethylenenaphthanate (PEN), and polyetherimide (PEI), commonly known under the trade name Ultem. These latter are all materials being generally less expensive than PI and PEEK, but having a more limited temperate use range. Ultem is a family of PEI products originally manufactured General Electric. Its intrinsic high dielectric strength, natural flame resistance, and extremely low smoke generation would make it very suitable for E&E applications. However, PEI is an amorphous thermoplastic with a glass transition temperature of around 216° C., as of a result of which PEI is less temperature-resistant, and which makes PEI less suited for use in carrier tapes. PEN and PET have very good dimensional properties, in particular under humidic conditions, and dielectric properties. PEN and PET are semi-crystalline polyesters with melting temperatures of about 240-260° C., which is still critical for several soldering processes.

Thus, there is a need for economically favorable polymer films with good dimensional stability, high temperature resistance and good dielectric properties.

The aim of the present invention is to provide a polymer film for use as a carrier tape in FCBs that can be made from cheaper materials than PI and PEEK, has a better high temperature resistance than PEI, and has good dimensional stability and good dielectric properties. Of course, the films much have a good quality in terms of uniformity and absence of defects. A further aim is to provide a process for producing such a polymer film in an economic way and/or environmentally friendlier way.

This aim has been achieved with the polymer film and the process according to the present invention.

The present invention resides in a biaxially stretched polymer film made of a polyamide composition comprising at least 80 weight percentage (wt. %) of a semi-crystalline semi-aromatic polyamide with a melting temperature (Tm) of at least 270° C., wherein the wt. % is relative to the total weight of the polymer composition.

The polymer film made of said polyamide composition with the required properties can be obtained with a process applying a strict processing window comprising steps wherein first the polymer composition is melt processed, the melt is cast into a film, the film is biaxially stretched and the biaxially stretched film is heat set at elevated temperature.

The polymer film made from said polymer composition and obtained by said process has a low thermal expansion coefficient over a wide temperature range. Furthermore, the said polymer film has a better high temperature resistance than PEI, and can be made from cheaper materials and is produced by an environmentally more friendly process than PI films.

The invention therefore also resides in polyamide films having a low thermal expansion coefficient. Suitably, the polymer films according to the invention has a thermal expansion coefficient (TEC) measured in plane of at most $40.10^{-6}$/K, or notated otherwise, of at most 40 ppm/K. The said in plane thermal expansion coefficient will herein also be denoted as $TEC_{ip}$. The $TEC_{ip}$ may well be in the range of 10-30 ppm/K, and preferably is lower than 25 ppm/K. With the in plane thermal expansion coefficient $TEC_{ip}$ is herein understood the average thermal expansion coefficient measured with the method according to ASTM D969-08, measured in plane over the temperature range of 20° C.-Tg. With the Tg is herein understood the glass transition temperature of the polyamide film. Above Tg even much lower TECs have been observed, in the range of 5-20 ppm/K.

It is noted that polymer films with good quality and with such good thermal properties could not be obtained from semi-crystalline aliphatic polyamides, or from semi-crystalline semi-aromatic polyamides if not processed under the proper conditions, while fully aromatic polyamides can not be melt processed at all. For conventional unstretched polyamide films below Tg, TEC values of around 80 ppm/K have been observed, whereas for corresponding measurements above Tg values as high as 120-200 ppm/K have been observed.

Polyamides are generally known to be very sensitive to moisture and to show relatively large dimensional changes under humid conditions, making them less suitable for many electrical and/or electronic applications. This could lead to tension forces between films and components mounted there upon. The polymer films according to the present invention when subjected to humid conditions show a remarkably low expansion in plane direction.

Suitably, the polymer films according to the invention have a coefficient of humidity expansion (CHE) measured in plane of at most $140.10^{-6}$/% RH, also notated as 140 ppm/% RH. The said in plane coefficient of humidity expansion will herein also be denoted as $CHE_{ip}$. The $CHE_{ip}$ may well be in the range of 40-120 ppm/K, and preferably is lower than 100 ppm/K.

With the in plane coefficient of humidity expansion $CHE_{ip}$ is herein understood the coefficient of humidity expansion measured with the method described further below at 25° C. on films conditioned at 50% relative humidity (RH), compared to the measurements on corresponding dried films.

Polymer films with such lower thermal expansion coefficient and lower coefficient of humidity expansion can be obtained by using semi-crystalline semi-aromatic polymers with a higher intrinsic crystallinity and/or applying a production process with a higher degree of biaxially stretching and/or heat setting at a higher temperature range for a more prolonged time.

The polymer composition in the polymer film according to the invention comprises a semi-crystalline semi-aromatic polyamide. With a semi-crystalline polymer is herein understood a polymer that it is partially crystalline and partially amorphous. In other words, the said polyamide comprises a crystalline phase next to an amorphous phase. The presence of a crystalline phase can be evidenced with standard methods, for example DSC measurements showing an endothermic melting peak. The presence of an amorphous phase can also be evidenced with standard methods, for example with DSC measurements showing an exothermic transition.

The degree of crystallinity of a semi-crystalline polymer depends on the temperature profile and processing history of the semi-crystalline polymer. With the term intrinsic crystallinity is meant the maximum degree of crystallinity obtainable for a semi-crystalline polymer under optimal processing conditions. In most practical situations a semi-crystalline polymer, after being processed, does not have a crystalline phase that is the crystalline phase does not need to be fully developed. As such an intrinsically semi-crystalline polymer might have no or only a low amount of crystalline phase. To have a quick screening of the intrinsic crystallinity of different semi-crystalline polymers is by processing these polymers under the same sub-optimal conditions and compare the degree of crystallinity by comparing the melting enthalpy as a measure for related to the amount of crystalline phase. A possible approach for the quick screening is by measuring the melting enthalpy of a polymer by DSC in the second heating run, rather than in the first heating run as described below for the polymer film.

With the term melting enthalpy, as being measured on the polymer film, is herein understood the endothermic energy, measured with the method according to ASTM D3418-03 by DSC in the first heating run with a heating rate of 10° C./min.

In correspondence with the above the intrinsic melting enthalpy, as being measured on the polymer composition, used for the film preparation, i.e. the polymer mounding composition, is herein understood the endothermic energy, measured with the method according to ASTM D3418-03 by DSC in the second heating run with a heating rate of 10° C./min.

With the term melting temperature, as being measured on the polymeric film, is herein understood the melting temperature, measured with the method according to ASTM D3418-03 by DSC in the first heating run with a heating rate of 10° C./min. Herein the maximum peak of the melting endotherm is taken as the melting temperature.

In correspondence with the term melting temperature, as being measured on the polymer mounding composition, is herein understood the melting temperature, measured with the method according to ASTM D3418-03 by DSC in the second heating run with a heating rate of 10° C./min. Herein the maximum peak of the melting endotherm is taken as the melting temperature.

With the term glass transition temperature (Tg), as being measured on the polymeric film, used herein is understood the temperature, measured with the method according to ASTM E 1356-91 by DSC in the first heating run with a heating rate of 10° C./min, falling in the glass transition range and showing the highest glass transition rate. The temperature showing the highest glass transition rate is determined as the temperature at the peak of the first derivative (with respect of time) of the parent thermal curve corresponding with the inflection point of the parental thermal curve.

The melting temperature of the semi-crystalline semi-aromatic polyamide comprised by the polymer composition in the polymer film is at least 270° C. and may vary over a large range. Suitably, the melting temperature is as high as 350° C. or higher, and preferably is in the range of 280-345° C., more preferably in the range of 290-340° C. The melting temperature can for example be 300° C., 310° C., 320° C. or 330° C. With a higher minimum melting temperature the polymer film has better thermal and dimensional properties. With a lower maximum melting temperature the polymer composition can be more easily processed into the cast film.

The semi-crystalline semi-aromatic polyamide in the polymer composition that is used for the polymer film according to the present invention suitably has a melting enthalpy, or intrinsically so, of at least 25 J/g. Preferably, the polymer film has a melting enthalpy of at least 25 J/g, more preferably at least 35 J/g, still more preferably at least 40 J/g, and even more preferably at least 50 J/g. In line with the present invention the melting enthalpy shall be primarily related to the melting point of the semi-crystalline semi-aromatic polyamide, and consequently shall be within, or close to the temperature range of 270-350° C. Preferably, at least 50%, more preferably at least 75% of the measured melting enthalpy shall be within the temperature range of 270-350° C.

The higher the melting enthalpy of the polymer film is, the better are the heat resistance and dimensional stability at elevated temperatures, also with better mechanical properties and a lower thermal expansion. Especially after stretching and heat setting of the film the melt enthalpy may increase and may attain values well above 70 J/g, and even as high as 90 J/g and higher, possibly attain values>90 J/g. Though the films may have a melt enthalpy as high as 120 J/g or higher, very good properties are already obtained when the melting enthalpy is in the range of 25-100 J/g.

The semi-crystalline semi-aromatic polyamide used in the polymer film can be a polyamide with repeat units derived from dicarboxylic acids and diamines wherein either the dicarboxylic acids, or the diamines, or both, comprises aromatic components while the remainder comprises aliphatic dicarboxylic acids and/or diamines, which can be linear, branched, or cyclic, and/or arylaliphatic dicarboxylic acids and diamines.

Examples of suitable aromatic dicarboxylic acids are terephthalic acid and isophthalic acid. Preferably, the semi-crystalline semi-aromatic polyamide comprises repeat units derived from terephthalic acid as the dicarboxylic acids. Examples of suitable aromatic diamines are meta-xylylene diamine and para-xylylene diamine.

Examples of suitable semi-crystalline semi-aromatic polyamides include homopolyamides like PA7T, PA9T, PA10T and PA12T having a melting temperature in the range of 270-350° C., and copolyamides of PA4T, PA5T, PA6T and/or PA8T, with for example PA7T, PA9T, PA10T, PA 11T PA12T, PA6, PA66, and/or PMXD6. The homopolymers PA4T, PA5T, PA6T and PA8T have a melting temperature above 340° C., but the copolymers can be formulated such as to have a melting temperature below 340° C. Suitable copolyamides include PA10T/6T, PA9T/M8T (wherein M8=2-Methyl octamethylene diamine), PA6T/5T, PA6T/M5T (wherein M5=2-Methyl pentamethylene diamine), and PA6T/10T. The polyamides may comprise other repeat units of other diamines and diacids, next to those mentioned in the copolyamides hereabove, thus forming more complex copolyamides. For further examples of suitable semi-crystalline semi-aromatic copolyamides see Kunststoff Handbuch, (Carl Hanser Verlag 1998) Band 3/4 Polyamide chapter 6.

A higher melting temperature can be accomplished e.g. by using a higher amount of terephthalic acid and/or alicyclic or aromatic diamines, or short chain linear aliphatic diamines. The person skilled in the art can adapt the melting point using common general knowledge and routine experiments.

In one particular embodiment of the invention, the semi-crystalline semi-aromatic copolyamide in the biaxially stretched polymer film consists of repeat units derived from dicarboxylic acids and diamines, aminocarboxylic acids and/or cyclic lactams, and optionally other units, wherein
(a) the dicarboxylic acids consist of
70-100 mole % terephthalic acid, and
0-30 mole % of an aromatic dicarboxylic acid different from terephthalic acid, and/or an aliphatic dicarboxylic acid;
(b) the diamines consist of
0-60 mole % of an diamine chosen from the group consisting of ethylene diamine, 1,3-propylenetrimethylene diamine, tetramethylene diamine, pentamethylene diamine, and 2-methyl-pentamethylenediamine, and
40-100 mole % of a diamine comprising at least 6 C-atoms, and
(c) the units derived aminocarboxylic acids and/or cyclic lactams are present in a total amount in the range of 5-30 mole %, relative to the total molar amount of repeat units derived from dicarboxylic acids, diamines and aminocarboxylic acids and/or cyclic lactams.
(d) the other units
are derived from compounds being mono-functional or tri-functional in amino and/or carboxylic acid groups, and
are present in a total amount in the range of 0-5 mole %, relative to the total molar amount of repeat units derived from dicarboxylic acids, diamines and aminocarboxylic acids and/or cyclic lactams.

Also very good results are obtained when the total amount of units c and d are limited in amount, meanwhile expanding the range for the molar amount for terephtalic acid units. Accordingly, in another particular embodiment of the invention, the semi-crystalline semi-aromatic copolyamide in the biaxially stretched polymer film consists of repeat units derived from dicarboxylic acids and diamines, and optionally other units, wherein
(a) the dicarboxylic acids consist of
50-100 mole % terephthalic acid, and
0-50 mole % of an aromatic dicarboxylic acid different from terephthalic acid, and/or an aliphatic dicarboxylic acid;
(b) the diamines consist of
0-60 mole % of an diamine chosen from the group consisting of ethylene diamine, trimethylene diamine, tetramethylene diamine and pentamethylene diamine, and
40-100 mole % of a diamine comprising at least 6 C-atoms, and
(c) the other units
are derived from aminocarboxylic acids and/or cyclic lactams and/or compounds being mono-functional or tri-functional in amino and/or carboxylic acid groups, and
are present in a total amount in the range of 0-5 mole %, relative to the total molar amount of repeat units derived from dicarboxylic acids and diamines.

An advantage of this particular embodiment is that the biaxially stretched polymer film after being plated with a copper layer is very low in copper migration under normal use conditions.

The polymer composition, used in the process according tot the intention and present in the film according to the invention may comprise next to the semi-crystalline semi-aromatic polyamide a limited amount of other components, which components may comprise another polymer and/or one or more additives.

These other components are typically present in an amount of at most 20 wt. %, and preferably in amount in the range of 0-10 wt. %, wherein the wt. % is relative to the total weight of the composition. The amount has to be limited to allow production of the films with the properties as described above.

Other polymers that might be present can be any polymer than is miscible or compatible with the semi-crystalline semi-aromatic polyamide and can be melt-processed under the processing conditions necessary for the semi-crystalline semi-aromatic polyamide. Preferably, the other polymer is an amorphous semi-aromatic polyamide or a semi-crystalline aliphatic polyamide. Preferably, the amorphous semi-aromatic polyamide has a high glass transition temperature (Tg) of at least 220° C., more preferably at least 250° C. Also preferably, the semi-crystalline aliphatic polyamide has a melting temperature (Tm) of at least 250° C., more preferably at least 280° C.

The additive, or additives, can be any auxiliary additive used in polyamide films, provided the individual amounts and combinations are chosen such that the melt processing and biaxial stretching is not jeopardized, at least not in significant extent. These additives may be chosen from the group consisting of plasticizers, stabilizers, dyes, optical brighteners, coloring agents, lubricants, nanoscale filler and strengthening materials, and preferably comprises heat stabilizers and/or nanoscale fillers. Types and amounts of additives can be selected by the skilled person by common general knowledge and routine measurement. Suitably, the additive, or additives, are present in an amount in the range of 0.01-10 wt. %, preferably 0.1-5 wt. %, 0.25-2.5 wt. %. Herein the wt. % are relative to the total weight of the polymer composition.

The invention also relates to a process for making a polymer film for use as a carrier in a PCB. The process according to the invention comprises the wherein
1) a polymer composition comprising a semi-crystalline semi-aromatic polyamide having a melting temperature Tm, a glass transition temperature Tg and an intrinsic melting enthalpy of at least 15 J/g is melt processed at a temperature above the melting temperature thereby forming a polymer melt;
2) the polymer melt obtained in step 1 is extruded into a film and the film is cast and immediately cooled to a temperature below the glass transition temperature;
3) the cast film obtained in step 2 is biaxially stretched at a temperature close to the glass transition temperature; and
4) the biaxially stretched film obtained in step 3 is heat set at a temperature between the glass transition temperature and the melting temperature.

To allow for the immediate cooling during the casting step to a temperature below the glass transition temperature, the film may be cast onto a surface having with a temperature, the surface temperature, being below the glass transition temperature.

The process is conducted applying the following conditions
1) during the melt processing step the polymer composition is kept above the melting temperature of the semi-crystalline semi-aromatic polyamide for a residence time of at most 1 minute;
2) during the casting step following after extrusion the film is cast on a surface with a surface temperature below 100° C., preferably below 50° C.;
3) during the biaxial stretching step, the cast film is biaxially stretched by a factor of at least 2×2; and/or the cast film is biaxially stretched at a temperature in the range from Tg−5° C. up to and including Tg+20° C., preferably in the range from Tg up to and including Tg+10° C.; and
4) during the heat setting step, the biaxially stretched film is kept at a temperature in the range from Tm−80° C. up to and including Tm−10° C., preferably in the range from Tm−60° C. up to and including Tm−25° C.

For the heat setting a short time, for example a few minutes to a few hours, at a temperature closer to Tg might be more effective than a longer time, for example 6 hours, or 12 hours or even longer, at a temperature further.

The process described above might eventually be split into two blocks, the first block comprising the first two steps 1) and 2) and the second block comprising the last two steps 3) and 4).

In between the first and the second block the film might be allowed to be cooled, e.g. to room temperature and/or conditioned under humid conditions. It is noted that such conditioning might have an influence on the Tg of the cast polymer film. The temperature applied during step 3) is determined in relation to the Tg of the polymer film as subjected to the biaxial stretching step, thus in relation to the Tg measured on the polymer film after such conditioning.

Preferably the biaxial stretching is applied on the film as obtained after extrusion and casting.

The process according to the invention may be modified such that in step 1) the film is extruded in the form of a tubular sheet and in step 2), instead of casting, a blow molding step applied. Step 2 than becomes: the polymer melt obtained in step 1 is extruded into a film and the film is blow molded. During blow molding the film is immediately cooled to a temperature below the glass transition temperature. In the next step the film can be biaxially stretched for example by a so-called double bubble method, as is described fro example in U.S. Pat. No. 6,479,562 B2.

The invention also relates to the use of the biaxially stretched polymer film according to the invention as a carrier tape in the production of FCBs, and to the use as a flexible carrier in a PCB. The biaxially stretched polymer film according to the invention can be provided with conductive layers, or with conductive pathways, tracks, or traces, using standard methods. In case for the methods etching processes are applied, the skilled person will be able to standard routine testing for selecting etching liquids that are most suited for polyamides.

The invention also relates to a flexible printed circuit board, comprising conductive metal layers born on the biaxially stretched polymer film according to the invention. The said printed circuit board can be used for making printed circuit board assemblies. For mounting the component on the printed circuit board according to the invention, conventional surface-mounting processes involving a wide variety of soldering techniques may be used. Because of the good dimensional stability and high temperature resistance of the biaxially stretched polymer film according to the invention, bulk wave soldering and reflow soldering can be applied.

The invention further relates to an electronic system or a printed circuit assembly (PCA), comprising a carrier, an electronic component with electrical leads mounted on or integrated within the carrier, and electrically conductive pathways born by the carrier and integrated with the electronic component, wherein the carrier is the biaxially stretched polymer film according to the invention, or a piece thereof.

After the printed circuit board (PCB) is completed, electronic components (e.g. chips) must be attached to form a functional "printed circuit board assembly" (PCBA). In through-hole construction, component leads are inserted in holes. In surface-mount construction, the components are placed on pads or lands on the outer surfaces of the PCB. In both kinds of construction, component leads are electrically and mechanically fixed to the board with a molten metal solder. Nowadays with the development of board lamination and etching techniques, the surface mounting concept has evolved into the standard printed circuit board fabrication process.

There is a variety of soldering techniques used to attach components to a PCB. High volume production is usually done with machine placement and bulk wave soldering or reflow ovens. Surface mounting lends itself well to a high degree of automation, reducing labor costs and greatly increasing production and quality rates.

The invention is illustrated with the following examples and comparative experiments.

Materials

PA-1 Polyamide 46, aliphatic polyamide, Tm 295° C., Tg 80° C., VN=230 ml/g

PA-2 Polyamide 6T/4T/66, semi aromatic copolyamide, Tm 325C, Tg 125° C., RV 1.9

Each of the polyamides comprised around 0.5-1.0 wt. % of a standard additive package comprising processing aids and heat stabilizers. Melting temperature (Tm), glass transition temperature (Tg), and relative viscosity (RV) mentioned herein were measured by the methods described below.

Methods

Viscosity: Relative Viscosity (RV)

The measurement of the relative viscosity (RV) was performed according to ISO 307, fourth edition. For the measurements pre-dried polymer samples were used the drying of which was performed under high vacuum (i.e. less than 50 mbar) at 80° C. during 24 hrs. Determination of the relative viscosity was done at a concentration of 1 gram of polymer in 100 ml solvent at 25.00±0.05° C.

DSC Measurements: Tg, Tm and Melting Enthalpy

The melting temperature (Tm) of the polymer molding composition was measured according to ASTM D3418-03 by DSC in the second heating run with a heating rate of 10° C./min.

The melting enthalpy of the polymer molding composition was measured according to ASTM D3418-03 by DSC in the second heating run with a heating rate of 10° C./min.

The glass transition temperature (Tg) of the polymer molding composition was measured according to ASTM E 1356-91 by DSC in the second heating run with a heating rate of 10° C./min, falling in the glass transition range and showing the highest glass transition rate.

The melting temperature (Tm) of the polymer film was measured according to ASTM D3418-03 by DSC in the first heating run with a heating rate of 10° C./min.

The melting enthalpy of the polymer film was measured according to ASTM D3418-03 by DSC in the first heating run with a heating rate of 10° C./min.

The glass transition temperature (Tg) of the polymer film was measured according to ASTM E 1356-91 by DSC in the first heating run with a heating rate of 10° C./min, falling in the glass transition range and showing the highest glass transition rate.

In Plane Coefficient of Humidity Expansion ($CHE_{ip}$)

The $CHE_{ip}$ was determined as follows: a film sample of 5×5 cm was cut out of a pre-dried film conditioned for 24 hours at 25° C. at 10% RH. The sample was placed in a conditioning cabinet such that they were smoothly clamped and pending free and conditioned at 25° C. and 50% RH for 24 hours. The dimensions of the so-conditioned sample were measured. The sample was placed again in the conditioning cabinet in the same manner and conditioned for another 24 hours at 25° C. and 80% RH. The dimensions of the so-conditioned samples were measured. The dimensions of the samples were measured both in the length and the width direction. From the measured dimensions the humidity dependent expansion coefficient of the individual samples is calculated according to the formula:

$$CHE_{individual\ sample, \%RH} = \{(L_1-L_0)/L_0\}/(R_1-R_0)$$

wherein R0 is the RH at which the dimension L0 was measured prior to the conditioning procedure at R1, and R1 is the RH at which the sample was conditioned and after which conditioning the dimension L1 was measured, L0 is the dimension measured prior to the conditioning at R1 and L1 is the dimension measured after the conditioning at R1.

The $CHE_{ip}$ of a film was calculated by averaging the CHE values in the two directions of the individual sample.

In Plane Thermal Expansion Coefficient $TEC_{ip}$

The in plane thermal expansion coefficient $TEC_{ip}$ was measured with the method according to ASTM D969-08, measured in plane over the temperature range of 20° C.-Tg. With the Tg is herein understood the glass transition temperature of the polyamide film. Above Tg even much lower TECs have been observed, in the range of 5-20 ppm/K.

Processing

The compounding materials were dried prior to processing. All film materials as produced were packed in alumina bags directly after production to prevent contact with moisture. The polyamide films were prepared by a film cast extrusion process. A single screw extruder respectively a double screw extruder (screw diameter 30 mm, L/D=30) equipped with a degassing port was connected to a feed block with a slot die with adjustable die-lip. The length of the slot die was 300 mm and the die-width was 0.8 mm. The extruder was fed with the polyamide material. The film was taken up by and cooled on a chill role. Furthermore, an air knife was applied. The distance between die and the position where the film touched the chill role was about 1 to 1.5 cm. The thickness of the film was regulated by the feeding rate and the chill role winding speed, thereby affecting the drawdown ratio between the chill role winding speed and the extrusion speed.

COMPARATIVE EXPERIMENT A

PA-1 was film processed in the single screw-extruder with a temperature setting of the extrusion zones, feedblock and die of 300° C. The temperature of the chill role was 3° C. This temperature quench was achieved by cooling of the chill role with ice water. The feeding rate of PA-1 and forming of the melt was such that the residence time of the polymer melt in the melt extrusion zones, feedblock and die was about 3 minutes. The chill role winding speed was adjusted to a drawdown ratio of about 10, thereby resulting in a film thickness of about 80 μm. The quality and optical transparency of the film as judged by the naked eye was judged as generally good but slightly hazy.

COMPARATIVE EXPERIMENT B

Comparative Experiment B was identical to Comparative Experiment A except that instead of the single screw extruder the double screw extruder was used. This allowed the residence time of the polymer melt in the melt extrusion zones, feedblock and die to be reduced to about 40 seconds. The film thickness was about 80 μm. The optical quality of the film judged by the naked eye was slightly better compared to the previous example.

COMPARATIVE EXPERIMENT C

Comparative Experiment C was identical to Comparative Experiment A except that instead of PA-1, polymer composition PA-2 was used. The temperature settings of the extruder were adjusted to 340° C. for the extrusion zones and 350° C. for the feedblock and die. The temperature of the chill role was 17° C. The film thickness was about 80 μm. The resulting film was transparent, but slightly discoloured and showed several bubbles and micropores.

EXAMPLE 1

In example 1 PA-2 material was film processed in the double screw extruder as according to Comparative Experiment with a temperature setting of the extrusion zones of 340° C. and of the feedblock and die of 350° C. as in Comparative Experiment C. The temperature of the chill role was 17° C. The resulting film was highly transparent, showed almost no discoloration and no micropores and had a thickness of about 80 μm.

EXAMPLE 2

Example 2 was identical to example 1 except that the chill role winding speed was adjusted that a thicker film with a thickness of about 150 μm was obtained. The resulting film was transparent, and showed almost no discoloration and very few micropores.

Stretching Experiments

Biaxial film stretching experiments were performed on the films from comparative experiments A-C and Example 1 and 2. These experiments were performed in a tentaframe device positioned in an oven. Film samples with areal dimensions of 10 cm*10 cm were clamped at the sides in this device. The stretching was performed on films taken from the alumina bags, clamped and consequently heated by hot air to the stretching temperature. Different stretching temperatures were applied resulting in different maximum stretching rates before rupture occurred. The maximum stretching ratios for the different experiments are reported in Table 1.

TABLE 1

Glass transition temperature and maximum stretching ratio (MSR) at different stretching temperatures for Comparative experiment A-C and Examples 1-2.

| | Tg (° C.) | Stretching Temperature (° C.) | MSR |
|---|---|---|---|
| CE-A | | | 1.4 |
| | | | 2.0 |
| CE-B | | | 1.9 |
| CE-C | 125 | 125 | 1.9 |
| EX-1 | 125 | 125 | 2.65 |
| EX-2 | 125 | 110 | 2.0 |
| | | 120 | 2.7 |
| | | 125 | 2.55 |
| | | 130 | 2.7 |
| | | 140 | 2.0 |

Annealing, Thermal Expansion and Humidity Expansion

Stretched films from example 1 were heat set under a nitrogen stream for 1 hour at 200° C. The films thus obtained were used in thermal expansion and humidity expansion measurements the results of which were compared with those of films from example 1 prior to stretching and heat setting. The results have been collected in table 2.

TABLE 2 thermal expansion and humidity expansion results for example 1.

| Example 1 | $CHE_{ip}$-50% RH [ppm/% RH] | $TEC_{ip}$ below Tg [ppm/K] |
|---|---|---|
| Before stretching and heat setting | 213 | 81 |
| After stretching and heat setting | 120 | 24 |

The invention claimed is:

1. A process for the production of a dimensionally stable polymer film, comprising steps of:
   (i) melt-processing a polymer moulding composition at a temperature above a melting temperature (Tm) to form a polymer melt thereof, wherein the moulding composition comprises at least 80 wt. % relative to the total weight of the polymer composition of a semi-crystalline semi-aromatic polyamide having a melting temperature (Tm) of at least 290° C. as measured according to ASTM D3418-03 by DSC with a heating rate of 10° C. and a glass transition temperature (Tg) measured according to ASTM E 1356-91 by DSC with a heating rate of 10° C., wherein the semi-crystalline semi-aromatic polyamide comprises repeat units derived from dicarboxylic acids and diamines, the dicarboxylic acids consisting of 70-100 mole % terephthalic acid, and other repeat units in a total amount in the range of 0-5 mole %, relative to the total molar amount of repeat units derived from dicarboxylic acids and diamines;
   (ii) extruding the polymer melt obtained in step (i) into a film and thereafter immediately casting and cooling the film to a temperature below the glass transition temperature (Tg) to form a cast film;
   (iii) biaxially stretching the cast film obtained in step (ii) at a temperature in a range of Tg-5° C up to and including Tg+10° C.; and
   (iv) heat-setting the biaxially stretched film obtained in step (iii) at a temperature between the glass transition temperature and the melting temperature to obtain a dimensionally stable polymer film having an average thermal expansion coefficient (TEC) in a temperature range of 20° C.-Tg, measured in a plane according to ASTM D696-08, of at most 40 ppm/K.

2. The process according to claim 1, wherein the semi-crystalline semi-aromatic polyamide in the polymer moulding composition has an intrinsic melting enthalpy of at least 25 J/g.

3. The process according to claim 1, wherein the process is conducted applying the following conditions:
   during the melt processing according to step (i), the polymer composition is kept above the melting temperature (Tm) of the semi-crystalline semi-aromatic polyamide for a residence time of at most 1 minute;
   during the casting of the film according to step (ii), the film is cast onto a surface with a surface temperature of at least 25° C. below the glass transition temperature (Tg);
   during the biaxial stretching according to step (iii), the cast film is biaxially stretched by a factor of at least 2×2; and
   during the heat-setting according to step (iv), the biaxially stretched film is kept at a temperature in the range from Tm-80° C. up to and including Tm-10° C.

4. The process according to claim 3, wherein the surface temperature of the surface onto which the film is cast according to step (ii) is at least 50° C. below the glass transition temperature (Tg).

5. The process according to claim 3, wherein the biaxially stretched film is kept at a temperature during heat-setting according to step (iv) in the range from Tm-60° C. up to and including Tm-25° C.

6. The process according to claim 1, wherein the polymer film has a coefficient of humidity expansion (CHE) measured in plane at a relative humidity of 50%, of at most 140 ppm/% RH.

7. The process according to claim 1, wherein the polymer film has a melting enthalpy of at least 15 J/g within a temperature range of 270-350° C., wherein the melting enthalpy is measured according to ASTM D3418-03 by DSC in a first heating run with a heating rate of 10° C/min.

* * * * *